(12) United States Patent
Hensel et al.

(10) Patent No.: US 9,602,028 B2
(45) Date of Patent: Mar. 21, 2017

(54) SAFETY FUNCTION CONTROL FOR AN ELECTRIC MACHINE AND METHOD OF OPERATING THE ELECTRIC MACHINE

(71) Applicant: BAUMUELLER NUERNBERG GMBH, Nuremberg (DE)

(72) Inventors: Uwe Hensel, Nuremberg (DE); Magdi Dimas-Zekri, Nuremberg (DE); Axel Helmerth, Wilnsdorf (DE)

(73) Assignee: Baumueller Nuernberg GmbH, Nuremberg (DE)

( * ) Notice: Subject to any disclaimer, the term of this patent is extended or adjusted under 35 U.S.C. 154(b) by 366 days.

(21) Appl. No.: 14/061,892

(22) Filed: Oct. 24, 2013

(65) Prior Publication Data

US 2014/0111128 A1   Apr. 24, 2014

(30) Foreign Application Priority Data

Oct. 24, 2012   (EP) .................................... 12007295

(51) Int. Cl.
*H02P 3/18* (2006.01)
*G05B 9/02* (2006.01)
(Continued)

(52) U.S. Cl.
CPC .................. *H02P 3/18* (2013.01); *G05B 9/02* (2013.01); *H02P 29/0241* (2016.02);
(Continued)

(58) Field of Classification Search
CPC ...... H02P 3/18; H02P 2201/07; H02P 29/021; G05B 9/02; H03K 17/79; H03K 17/691; H03K 17/18
(Continued)

(56) References Cited

U.S. PATENT DOCUMENTS 4,054,943 A * 10/1977 Mundt ...................... H02P 3/18
                                                   318/701
6,023,178 A *  2/2000 Shioya .............. H02M 3/33523
                                                   327/176
(Continued)

FOREIGN PATENT DOCUMENTS

CN         101937191 A    1/2011
CN         102185510 A    9/2011
(Continued)

OTHER PUBLICATIONS

Abb, "Applikationsanleitung Für die Funktion Sicher abgeschaltetes Moment Safe Torque Off (STO-Funktion)" ABB Handbooks-ACSM1 Frequenzumrichter Handbücher, Oct. 1, 2007, pp. 1-18, vol. 3AUA0000023089, No. REV B / DE, XP002512330. 1.

(Continued)

*Primary Examiner* — Shawki S Ismail
*Assistant Examiner* — Muhammad S Islam
(74) *Attorney, Agent, or Firm* — Laurence A. Greenberg; Werner H. Stemer; Ralph E. Locher

(57) ABSTRACT

An apparatus and a method actuate a frequency converter of an electric machine having a safety function, in particular a safe-torque-off (STO) function. Wherein, by a preferably clocked converter circuit, an electrically isolated output voltage is generated from an input voltage, from which output voltage a control signal is generated for the frequency converter for the operation thereof in accordance with standards and for triggering the safety function. An actuation signal is generated for a semiconductor switch which is periodically connected to the input voltage, and the output voltage is limited when the output voltage exceeds a switching threshold.

11 Claims, 2 Drawing Sheets

(51) Int. Cl.
    *H03K 17/18*    (2006.01)
    *H03K 17/691*   (2006.01)
    *H03K 17/79*    (2006.01)

(52) U.S. Cl.
    CPC .......... *H02P 2201/07* (2013.01); *H03K 17/18* (2013.01); *H03K 17/691* (2013.01); *H03K 17/79* (2013.01)

(58) Field of Classification Search
    USPC ........................................ 320/140
    See application file for complete search history.

(56) References Cited

U.S. PATENT DOCUMENTS

| | | | | |
|---|---|---|---|---|
| 6,487,059 | B2* | 11/2002 | Bontempo | H02M 3/33523 |
| | | | | 361/90 |
| 6,559,689 | B1* | 5/2003 | Clark | H03K 17/063 |
| | | | | 327/337 |
| 8,558,415 | B2 | 10/2013 | Fujita et al. | |
| 8,971,057 | B2 | 3/2015 | Smith | |
| 2010/0156435 | A1* | 6/2010 | Kangas | G05B 9/02 |
| | | | | 324/538 |
| 2010/0244775 | A1* | 9/2010 | Smith | H02M 3/33584 |
| | | | | 320/140 |
| 2010/0327667 | A1 | 12/2010 | Fujita et al. | |
| 2011/0260671 | A1* | 10/2011 | Jeung | H02P 6/08 |
| | | | | 318/701 |
| 2012/0104981 | A1* | 5/2012 | Tseng et al. | 318/400.3 |
| 2013/0054724 | A1* | 2/2013 | Yundt | H04L 12/40182 |
| | | | | 709/208 |

FOREIGN PATENT DOCUMENTS

| | | |
|---|---|---|
| DE | 102011003922 A1 | 8/2012 |
| EP | 2495869 A2 | 9/2012 |
| TW | 201106604 A | 2/2011 |

OTHER PUBLICATIONS

European Patent Office Search Report, dated Mar. 5, 2013.

* cited by examiner

SAFETY FUNCTION CONTROL FOR AN ELECTRIC MACHINE AND METHOD OF OPERATING THE ELECTRIC MACHINE

CROSS-REFERENCE TO RELATED APPLICATION

This application claims the priority, under 35 U.S.C. §119, of European application EP 12 007 295.4, filed Oct. 24, 2012; the prior application is herewith incorporated by reference in its entirety.

BACKGROUND OF THE INVENTION

Field of the Invention

The invention relates to a method for controlling a safety function of an electric machine operated or supplied with power by a frequency converter. It also relates to an apparatus for implementing the method, wherein safety function is understood to mean, in particular, the so-called safe-torque-off (STO) function. A method of this type and a corresponding apparatus are known from published, European patent EP 2 495 869 A2.

In the field of drive technology with electric machines, in particular with synchronous or asynchronous motors, safety-oriented functions are necessary in order to reliably avoid injuries as a result of undesired or unexpected rotations of the drives. In this connection, an essential safety function is safe stopping of the drive, referred to as safe-torque-off (STO), by the drive being safely isolated from the power supply thereto in order to coast down after triggering of the safety function and, depending on the rotational speed and the connected torque, to reliably reach its standstill state.

In the case of conventional three-phase motors which are fed in a controlled manner by frequency converters, the control or triggering of the or each safety function takes place at the frequency converter, by the frequency converter, and hence also the three-phase motor or the electric machine, being isolated from the power supply. A 24 V DC input voltage, which is supplied to the frequency converter via a switch, for example a relay, is usually used to supply power to the frequency converter. If the switch is actuated to disconnect the machine during a stop function, the input voltage required for controlling the frequency converter, and hence the power supply thereto, is disconnected.

For this purpose, a safe-torque-off connection (STO function) is known from U.S. Pat. No. 7,868,619 B2, in which the 24 V input voltage for the control device and for the driver of the power switch or power semiconductor switch of the frequency converter, the driver being actuated by the control device, is safely interrupted by a two-pole switch, and hence the power supply to the electric machine is also safely interrupted.

A control device in the form of a frequency converter with STO function for an electric motor with a first galvanically isolating transmission device, which transmission device only generates an output signal for actuating power semiconductors (IGBTs) of the frequency converter which provides the operating voltage for an electric motor when a supply voltage is present, is known from published, non-prosecuted German patent application DE 10 2011 003 922 A1, and from published, European patent application EP 2 495 869 A2 mentioned at the outset. A device provided for this purpose contains a resonant circuit, the supply voltage of which is dependent on an actuator signal which in turn signals a permissible operating state of the electric motor. The resonant-circuit signal is transmitted via a second transmission device to an amplifying and decoupling circuit and to a rectifier which generates the supply voltage for the first transmission device for actuating the power semiconductors.

SUMMARY OF THE INVENTION

The problem addressed by the invention is that of specifying an improved method and a particularly suitable apparatus for controlling a safety function of an electric machine. Wherein the control is intended to function reliably even at an input voltage of greater than or equal to 60 V while ensuring the safety function, in particular with, at the same time, power losses which are as small as possible.

With the foregoing and other objects in view there is provided, in accordance with the invention, a method for actuating a frequency converter of an electric machine having a safety function. The method includes generating an electrically isolated output voltage for a normal operation of the frequency converter and for triggering the safety function from an input voltage, the output voltage is generated by a converter circuit. The output voltage is supplied to a threshold switch for generating a binary control signal for the frequency converter. The binary control signal activates an operation of the frequency converter when the output voltage exceeds an upper threshold value, and the binary control signal triggers the safety function for deactivating the operation of the frequency converter when the output voltage undershoots a lower threshold value. An actuation signal is generated from the output voltage for a semiconductor switch of the converter circuit, the semiconductor switch being periodically connected to the input voltage. The output voltage is limited when the output voltage exceeds a switching threshold.

For this purpose, an electrically isolated DC output voltage is generated from a DC input voltage, and a control signal for the frequency converter for the normal operation thereof and for triggering the safety function is generated from the electrically isolated DC output voltage. In addition, an actuation signal for a semiconductor switch which is periodically connected to the input voltage is generated and the output voltage is reduced or limited when the output voltage exceeds a switching threshold or a threshold value.

In this case, the invention is based on the idea that, although in the simplest manner a voltage divider circuit could be used in order to control even a relatively large voltage range of the input voltage of greater than or equal to 60 V, with or without a downstream optocoupler for galvanic isolation, the correspondingly high power losses at the ohmic resistors of the voltage divider in the case of such high input voltages are disadvantageous. Even the use of a constant current source, with or without a downstream optocoupler, leads to undesirably high power losses at a correspondingly high input voltage of the required 60 V. Known circuits for voltage limitation could also be used in order to limit voltage increases which occur in the event of a fault to the 24 V input voltage. However, such voltage-limiting circuits do not ensure that the required safety function is guaranteed in an unaffected manner and that an undesired disconnection of the input voltage is reliably prevented.

In contrast to this, the method according to the invention and the apparatus according to the invention are provided and designed to permit an operating case with an increased input voltage of, for example, 60 V for a digital input of a downstream control circuit for the frequency converter with at the same time low power losses and to reliably ensure the required safety function, in particular the STO function.

For this purpose, the apparatus provides a preferably clocked converter circuit having a transformer for electrically isolated energy transmission, to which transformer is assigned, on the primary side, an actuatable semiconductor switch and, on the secondary side, a rectifier. The converter circuit is embodied here in terms of circuitry as a type of a clocked voltage converter which operates, for example, as a flyback converter or else as a forward converter and converts the DC input voltage, which is 24 V in the normal case, into a DC output voltage which is provided to a device for generating a control signal for the frequency converter.

The device connected downstream of the rectifier is also configured, in terms of circuitry and/or programming, to generate a clocked actuation signal for the semiconductor switch of the converter circuit when the input voltage, and hence the output voltage, of the device exceeds a predefined maximum value. As a result of the actuation signal, the output voltage, if the latter exceeds the maximum value, is limited by the open-loop or closed-loop control. For this purpose, the device is connected on the actuation side to the semiconductor switch via a feedback loop, preferably with a galvanically isolating element, particularly in the form of an optocoupler. The feedback loop expediently contains a pulse modulator for adjusting the operating frequency of the semiconductor switch on the basis of the clock or actuation signal generated by the device. In this case, the pulse modulator is suitably a pulse-width modulator (PWM) and/or a pulse-interval modulator (PIM) for adjusting the duty cycle of the clock or actuation signal for the semiconductor switch.

The open-loop and/or closed-loop control device preferably has a comparator and threshold-switch function, to which the output voltage of the converter circuit is applied, for activating the actuation signal for the semiconductor switch. Furthermore, the open-loop and/or closed-loop control device suitably contains a setpoint/actual value comparator and a pulse modulator connected downstream of the comparator for adjusting the operating frequency of the semiconductor switch on the basis of a deviation of the output voltage from a setpoint value.

In an expedient configuration of the apparatus, the open-loop and/or closed-loop control device has, connected downstream, or is assigned a Schmitt trigger as threshold switch to which the output voltage of the converter circuit is supplied for generating a binary control signal for the frequency converter. The control signal preferably has a high level for operating the frequency converter when the output voltage exceeds an upper threshold value, and a low level which triggers the safety function when the output voltage undershoots a lower threshold value.

The converter circuit and the open-loop and/or closed-loop control device are expediently embodied with redundancy. In addition, the functionality of the open-loop and/or closed-loop control device, in particular the comparator and threshold-switch function thereof, is suitably integrated in two redundant microprocessors, the inputs of which for the output voltage of the converter circuit are coupled to the respective other microprocessor.

It is particularly preferable for the semiconductor switch to be connected on the control side to the open-loop and/or closed-loop control device via a galvanically isolating element in the form of an optocoupler. In a particularly preferred variant of the converter circuit, the or, in the case of a redundant design, each semiconductor switch forms a series circuit with the primary winding of the transformer, at which series circuit the input voltage is present. A capacitor for buffering the usually at least slightly fluctuating input voltage is then suitably connected in parallel with the series circuit. The control input (gate) of the semiconductor switch, preferably embodied as a MOSFET, is then expediently connected to the buffer capacitor via the phototransistor of the galvanically isolating optocoupler.

The advantages achieved with the invention consist, in particular, in that by using a converter circuit for controlling a safety function of an electric machine, a comparatively large or broad input voltage range of more than 60 V is controlled in a safe and, in particular in respect of the apparatus according to the invention, inherently safe manner and with only low power losses. Owing to the redundant design of the converter circuit and the device for triggering the safety function, in particular the STO function, and the mutual monitoring thereof, the safety and inherent safety of the apparatus according to the invention are further increased.

Other features which are considered as characteristic for the invention are set forth in the pended claims.

Although the invention is illustrated and described herein as embodied in a safety function control for an electric machine and a method of operating the electric machine it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

DETAILED DESCRIPTION OF THE INVENTION

Figure 1:
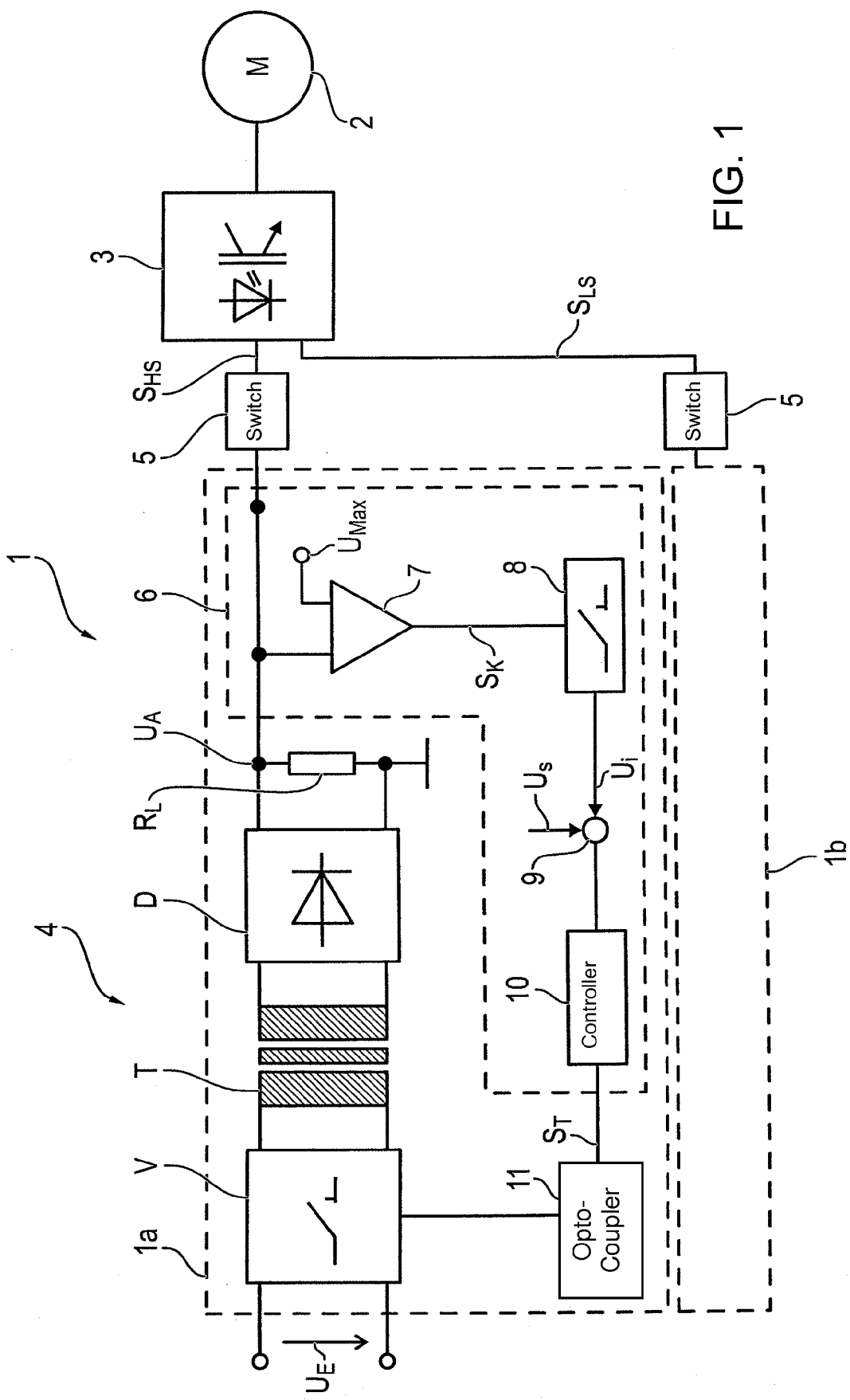
FIG. 1 is a schematic block circuit diagram of an apparatus for controlling a frequency converter of an electric machine having, on an input side, a converter circuit for triggering a safety function and for limiting voltage according to the invention.

Components which correspond to one another in the two figures are provided with the same references. Referring now to the figures of the drawings in detail and first, particularly to FIG. 1 thereof, there is shown an apparatus 1 for controlling a safety function, in particular the safe-torque-off (STO) function, of a three-phase motor 2 as an electric machine which is supplied power or operated by a frequency converter 3. The apparatus 1 has a clocked converter circuit 4 with a transformer T, a semiconductor switch V being connected upstream thereof on a primary side and a rectifier D being connected downstream thereof on the secondary side. The converter circuit 4 converts a DC input voltage $U_E$ into a DC output voltage $U_A$ which can be tapped off at a load resistor $R_L$ connected to ground or a reference potential. The voltage is converted or transformed by the electronic semiconductor switch V which is actuated at a certain switching or operating frequency and by the transformer T for electrically isolated energy transmission and by the rectifier D for decoupling the DC output voltage $U_A$.

Here, the transformer T can operate as an energy store of a clocked fly-back converter with galvanic isolation between the converter input and the converter output or else as galvanically isolating component of a so-called forward converter. In both converter variants, the semiconductor switch V is opened in a regularly controlled manner, with the result that the magnetic field in the transformer T can be reduced. The input voltage can be, for example, $U_E$=24 V to $U_E$=60 V.

The output voltage $U_A$ is passed to a threshold switch 5, preferably in the form a Schmitt trigger, which generates a binary control signal for the frequency converter 5. If the output voltage $U_A$ exceeds an upper threshold value $U_1$, for example $U_1$=11 V, then the threshold switch 5 produces a binary control signal $S_{HS}$ with a high level, with the result that the frequency converter 3 connected downstream of the threshold switch 5 actuates the three-phase motor 2 in the normal manner. If the output voltage $U_A$ undershoots a lower threshold value $U_2$, for example $U_2$=5 V, then the threshold switch 5 produces a low level as binary control signal $S_{HS}$, which triggers the safety function, in particular the safe-torque-off and hence safe stopping of the three-phase motor 2.

In addition, the apparatus 1 contains an open-loop and/or closed-loop control device 6 which passes the output voltage $U_A$ generated by the converter circuit 4 to the threshold switch 5 for controlling the frequency converter 3, wherein the output voltage $U_A$ is converted into the binary or digital control signal $S_{HS}$, $S_{LS}$ by the Schmitt trigger 5. The control signal $S_{HS}$ activates or deactivates, depending on the high or low level, the so-called high side (HS) of the bridge circuit, which is normally constructed from power semiconductors (power switches or power semiconductor switches), in particular IGBTs, of the frequency converter 3, in order to signal the normal operation of the frequency converter 3 or to trigger the safety function.

A control signal $S_{LS}$, which is generated in a similar way and is in turn converted into a binary control signal $S_{LS}$ by a threshold switch in the form of a Schmitt trigger 5, analogously controls (activates or deactivates) the so-called low side (LS) of the bridge circuit of the frequency converter 3. For this purpose, the apparatus 1 contains two identically configured control modules 1a, 1b which are also designated high-side or HS control module 1a and low-side or LS control module 1b below.

The open-loop and/or closed-loop control device 6 also contains a threshold switch 7, preferably in the form of a comparator, to which the output voltage $U_A$ of the converter circuit 4 is supplied on the input side. The comparator 7 compares the output voltage $U_A$ with a maximum value $U_{Max}$ which is, for example, $U_{Max}$=60 V. If this maximum value $U_{Max}$ is exceeded, the comparator 7 generates a control or switching signal $S_K$ on the output side, as a result of which a switch 8, for example in turn embodied by a semiconductor switch or the like, passes the output voltage $U_A$ to a setpoint/actual value comparator 9. In the event of a deviation of the actual value $U_i$ of the output voltage $U_A$ from a setpoint value $U_s$ which corresponds, for example, to the input voltage $U_E$=$U_s$=24 V, a controller 10, preferably a PWM controller, generates a clock signal $S_T$ for modified actuation of the semiconductor switch V. In this case, the semiconductor switch V is actuated by a galvanically isolating element 11, preferably in the form of an optocoupler.

By the controller 10, the duty cycle of the pulse modulation, for example a pulse-width modulation (PWM) and/or a pulse-interval modulation (PIM), is adjusted in such a way that the output voltage $U_A$ is adjusted or reduced to the setpoint value $U_s$.

The transformer T is periodically connected on the primary side to the input voltage $U_E$ by the semiconductor switch V and is operated for this purpose at a certain constant clock or operating frequency as long as the output voltage $U_A$ undershoots the predefined maximum voltage $U_{Max}$. Only when the maximum voltage $U_{Max}$ is exceeded is the open-loop or closed-loop control brought into operation via the threshold switch or comparator 7, with the result that, by changing the clock or operating frequency of the semiconductor switch V, the energy transmission via the transformer T is reduced and the output voltage $U_A$ is adjusted by closed-loop or open-loop control to the predefined setpoint voltage $U_s$. Safe operation of the apparatus 1 is therefore ensured by the open-loop and/or closed-loop control device 6 and the converter circuit 4, even in the event of a comparatively high input voltage $U_E$ of greater than or equal to 60 V, without impairing the required safety function of the electric machine 2.

Figure 2:
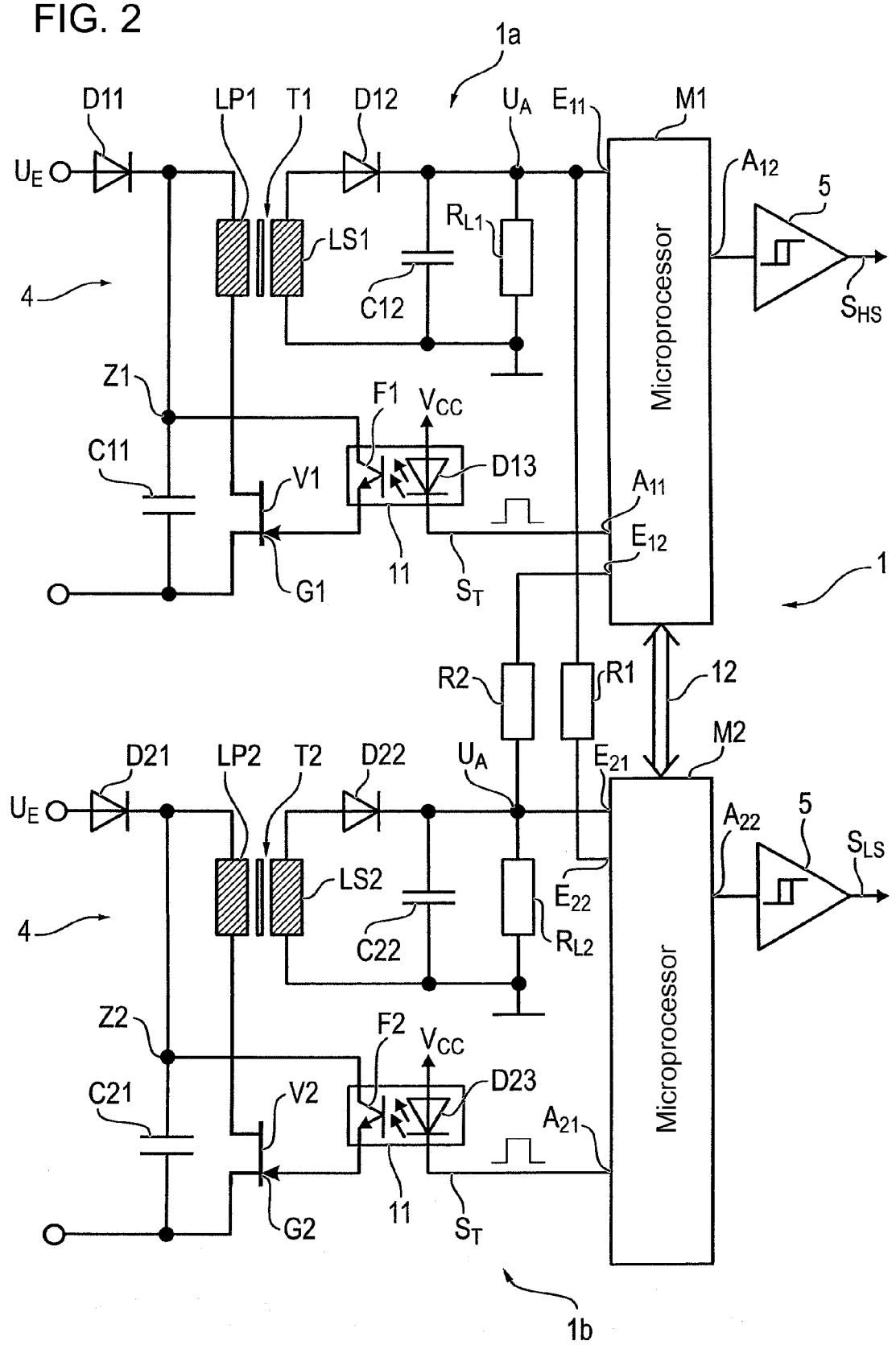
FIG. 2 is a schematic block circuit diagram of a redundant design, in terms of circuitry, of the converter circuit with, connected downstream, a device for triggering the safety function with mutual monitoring.

FIG. 2 shows a preferred design of the converter circuit 4. The output of this converter circuit is connected to an input $E_{11}$ of a microprocessor M1 in which the functionality of the comparator 7 and the switch 8 and the comparator 9 and the controller 10 is implemented using software. Together with the upstream converter circuit 4, the microprocessor M1 forms the first or HS control module 1a of the apparatus 1.

The second or LS control module 1b is configured in a similar manner and in turn has an identical redundant converter circuit 4 and a correspondingly redundant microprocessor M2 for implementing the functionality of the open-loop and/or closed-loop control device 6. The redundant microprocessors M1 and M2 are connected to the respective Schmitt trigger 5 via outputs $A_{12}$, $A_{22}$, the Schmitt triggers providing, for their part, the binary control signals $S_{HS}$ and $S_{LS}$, respectively, at the frequency converter 3 while ensuring the safety function of the electric machine 2. The functionality of the Schmitt triggers 5 can likewise be integrated in the microprocessors M1, M2.

The microprocessors M1, M2 are coupled to one another via resistors R1 and R2, respectively. Further couplings of the microprocessors M1 and M2 are indicated by the arrow 12, which symbolizes an exchange of data or information between the microprocessors M1, M2. In order to couple the microprocessors M1, M2, the inputs $E_{11}$, $E_{21}$ thereof, via which the output voltage $U_A$ of the converter circuit is supplied, are connected by the resistors R1, R2 to in each case one further input $E_{12}$, $E_{22}$ of the microprocessors M1 and M2, respectively.

In the identically designed converter circuits 4, the semiconductor switch V1, V2 of the respective primary winding LP1, LP2 of the transformer T1 and T2, respectively, are connected in series downstream. A buffer capacitor C11 or C21 is connected in parallel with the series circuit which contains the respective primary winding LP1, LP2 and the semiconductor switch V1, V2 and is preferably connected to the input voltage $U_E$ via a diode D11, D21 as polarity reversal protection. The secondary coil LS1, LS2 of the respective transformer T1, T2 has a rectifier diode D12, D22 connected in series downstream thereof and a smoothing capacitor C12, C22 connected in parallel therewith, the smoothing capacitor in turn having the load resistor $R_{L1}$ or $R_{L2}$, respectively, connected in parallel therewith.

In the embodiment according to FIG. 2, the open-loop and/or closed-loop control device 6 is implemented by a comparator and threshold-switch functionality which is integrated in the microprocessors M1, M2 using software. The actuation side (gate side) of the semiconductor switches V1, V2, which are preferably embodied as MOSFETs, is connected to a corresponding clock output $A_{11}$, $A_{12}$ of the respective microprocessor M1 or M2 via the optocoupler 11 as galvanically isolating element within the feedback loop. The clock signal $S_T$ generated is, as is illustrated symbolically, a square wave signal which the photodiode D13, D23 of the optocoupler 11 periodically applies to a supply voltage $V_{CC}$, with the result that this is alternately light or dark. Consequently, the phototransistor F1, F2 of the respective optocoupler 11 is periodically switched on or off and hence passes the voltage level of a tap Z1, Z2 of the buffer capacitor C11, C21 to the control input (gate) G1, G2 of the respective semiconductor switch V1 or V2. As a result, the respective semiconductor switch V1, V2 periodically connects the primary coil LP1, LP2 of the transformer T1 or T2 to the input voltage $U_E$. Depending on the respectively adjusted operating frequency or the duty cycle predefined by open-loop or closed-loop control, the output voltage $U_A$, which is supplied to the respective microprocessor M1 or M2 as input voltage, is adjusted at the capacitor C12, C22 and at the load resistor $R_{L1}$, $R_{L2}$ on the secondary side of the transformer downstream of the rectifier D12, D22.

The functionality of the threshold circuit when the maximum value $U_{Max}$ of the output voltage $U_A$ or the input voltage $U_E$ is reached or exceeded, as described with reference to the exemplary embodiment in FIG. 1, and the functionality of the clock generation for the semiconductor switch V1, V2 is installed in the microprocessors M1, M2 as software or an algorithm.

Owing to the redundancy of the two control modules 1a and 1b and as a result of the coupling and mutual monitoring thereof, the safety function is always triggered even if one of the control modules 1a or 1b of the apparatus performs an error function or completely fails. As a result of this, a high degree of inherent safety of the apparatus 1 and hence a high degree of safety of the apparatus 1 overall is ensured.

The invention is not restricted to the exemplary embodiment described above. Rather, a person skilled in the art can also derive other variants of the invention therefrom, without departing from the subject matter of the invention. In particular, all individual features described in connection with the exemplary embodiment can furthermore also be combined with one another in another way, without departing from the subject matter of the invention.

The invention claimed is:

1. A method for actuating a frequency converter of an electric machine having a safety function, which comprises the steps of:
generating an electrically isolated output voltage for a normal operation of the frequency converter and for triggering the safety function from an input voltage, the output voltage generated by a clocked converter circuit having a semiconductor switch being intermittently switched to the input voltage;
supplying the output voltage to a threshold switch for generating a binary control signal for the frequency converter, the binary control signal activating an operation of the frequency converter when the output voltage exceeds an upper threshold value, the binary control signal triggering the safety function for deactivating the operation of the frequency converter when the output voltage undershoots a lower threshold value; and
feeding the output voltage into a control and/or regulation device for adjusting an actuation signal for the semiconductor switch of the converter circuit such that the output voltage is reduced to a target value when the output voltage exceeds a maximum switching threshold, the control and/or regulation device having a comparator for comparing the output voltage to the maximum switching threshold and outputting a further control signal, the further control signal being forwarded by a further switch and the further control signal being used for generating the actuation signal.

2. An apparatus for controlling a frequency converter of an electrical machine having a safety function, the apparatus comprising:
a clocked converter circuit containing a transformer having, on a primary side, a semiconductor switch being intermittently switched to an input voltage for providing an electrically isolated output voltage and, on a secondary side, a rectifier;
a threshold switch disposed downstream of said rectifier and receiving the output voltage, said threshold switch generating a binary control signal to be fed to the frequency converter, said binary control signal activating an operation of the frequency converter if the output voltage exceeds an upper threshold and deactivating the operation of the frequency converter for the triggering of the safety function if the output voltage falls below a lower threshold; and
an open-loop and/or closed-loop control device connected downstream of said rectifier, said open-loop and/or closed-loop control device receiving the output voltage and adjusting an actuation signal for said semiconductor switch for reducing the output voltage to a target value when the output voltage exceeds a maximum value, said open-loop and/or closed-loop control device having a comparator and a threshold-switch, said comparator receiving and comparing the output voltage to the maximum value and outputting a further control signal forwarded to said threshold-switch, said further control signal being used for generating the actuation signal for said semiconductor switch.

3. The apparatus according to claim 2, wherein said open-loop and/or closed-loop control device contains a setpoint/actual value comparator and a pulse modulator, connected downstream of said setpoint/actual value comparator, for adjusting an operating frequency of said semiconductor switch on a basis of a deviation of the output voltage of said converter circuit from a setpoint voltage value.

4. The apparatus according to claim 2, further comprising a galvanically isolating element, wherein said semiconductor switch is connected on a control side to said open-loop and/or closed-loop control device via said galvanically isolating element.

5. The apparatus according to claim 2, further comprising a Schmitt trigger, wherein said open-loop and/or closed-loop control device is coupled to said Schmitt trigger as said threshold switch to which the output voltage of said converter circuit is supplied for generating the binary control signal for the frequency converter.

6. The apparatus according to claim 2, wherein:
said transformer has a primary winding; and
said semiconductor switch forms, with said primary winding of said transformer, a series circuit to which the input voltage is applied.

7. The apparatus according to claim 2, further comprising a microprocessor, said comparator and said threshold-switch of said open-loop and/or closed-loop control device integrated in said microprocessor.

8. The apparatus according to claim 2, further comprising a microprocessor and said open-loop and/or closed-loop control device is integrated in said microprocessor.

9. The apparatus according to claim 4, wherein said galvanically isolating element is an optocoupler.

10. The apparatus according to claim 6, further comprising:
- an optocoupler having a phototransistor; and
- a buffer capacitor connected in parallel with said series circuit, said semiconductor switch being connected to said capacitor on a control input side via said phototransistor of said optocoupler.

11. The apparatus according to claim 7, wherein said microprocessor is one of two redundant microprocessors having inputs for receiving the output voltage of said converter circuit and are coupled to said respective other redundant microprocessor.

* * * * *